(12) United States Patent
Mimura et al.

(10) Patent No.: US 10,177,068 B2
(45) Date of Patent: Jan. 8, 2019

(54) HEAT CONDUCTIVE INSULATING SHEET, POWER MODULE, AND MANUFACTURING METHOD THEREOF

(71) Applicant: MITSUBISHI ELECTRIC CORPORATION, Chiyoda-ku (JP)

(72) Inventors: Kenji Mimura, Chiyoda-ku (JP); Yurie Nakamura, Chiyoda-ku (JP); Xiaohong Yin, Chiyoda-ku (JP); Kazuhiro Tada, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 455 days.

(21) Appl. No.: 14/770,532

(22) PCT Filed: Mar. 11, 2014

(86) PCT No.: PCT/JP2014/056338
§ 371 (c)(1),
(2) Date: Aug. 26, 2015

(87) PCT Pub. No.: WO2014/142123
PCT Pub. Date: Sep. 18, 2014

(65) Prior Publication Data
US 2016/0013116 A1    Jan. 14, 2016

(30) Foreign Application Priority Data
Mar. 15, 2013   (JP) ................ 2013-052670

(51) Int. Cl.
*H01L 23/373* (2006.01)
*H01L 23/433* (2006.01)
(Continued)

(52) U.S. Cl.
CPC ...... *H01L 23/3733* (2013.01); *B29C 35/0288* (2013.01); *B29C 45/0013* (2013.01);
(Continued)

(58) Field of Classification Search
CPC ..... H01L 2924/181; H01L 2924/00012; H01L 2224/29499; H01L 2224/32245;
(Continued)

(56) References Cited

U.S. PATENT DOCUMENTS

2010/0226095 A1    9/2010 Mimura et al.

FOREIGN PATENT DOCUMENTS

| JP | 2001-189325 A | 7/2001 |
| JP | 2003-060134 A | 2/2003 |

(Continued)

OTHER PUBLICATIONS

International Search Report dated Jun. 24, 2014 for PCT/JP2014/056338 filed on Mar. 11, 2014.

*Primary Examiner* — Frances Tischler
(74) *Attorney, Agent, or Firm* — Oblon, McClelland, Maier & Neustadt, L.L.P.

(57) ABSTRACT

A method for manufacturing, by a transfer mold method, a power module equipped with a heat conductive insulating sheet in which an inorganic filler including secondary aggregated particles formed by aggregation of primary particles of scaly boron nitride is dispersed in a thermosetting resin, where curing of an uncured or semi-cured heat conductive insulating sheet during transfer molding is advanced under specific conditions. The method for manufacturing a power module equipped with a heat conductive insulating sheet has excellent thermal conductivity and electric insulation ability.

12 Claims, 2 Drawing Sheets

(51) Int. Cl.
*H01L 23/495* (2006.01)
*H01L 23/29* (2006.01)
*H01L 23/00* (2006.01)
*B29C 45/00* (2006.01)
*B29C 45/02* (2006.01)
*B29C 45/14* (2006.01)
*B29C 35/02* (2006.01)
*H01L 23/31* (2006.01)
*B29K 63/00* (2006.01)
*B29K 105/16* (2006.01)
*B29K 509/04* (2006.01)
*B29L 31/34* (2006.01)

(52) U.S. Cl.
CPC ............. *B29C 45/02* (2013.01); *B29C 45/14* (2013.01); *H01L 23/295* (2013.01); *H01L 23/3737* (2013.01); *H01L 23/4334* (2013.01); *H01L 23/49575* (2013.01); *H01L 24/29* (2013.01); *B29C 45/14655* (2013.01); *B29C 2045/14663* (2013.01); *B29K 2063/00* (2013.01); *B29K 2105/16* (2013.01); *B29K 2509/04* (2013.01); *B29K 2995/0007* (2013.01); *B29K 2995/0013* (2013.01); *B29L 2031/3481* (2013.01); *H01L 23/3107* (2013.01); *H01L 2224/29499* (2013.01); *H01L 2224/32245* (2013.01); *H01L 2924/181* (2013.01)

(58) Field of Classification Search
CPC ............... H01L 23/295; H01L 23/3107; H01L 23/3733; H01L 23/3737; H01L 23/4334; H01L 23/49575; H01L 24/29; B29C 2045/14663; B29C 35/0288; B29C 45/0013; B29C 45/02; B29C 45/14; B29C 45/14655; B29K 2063/00; B29K 2105/16; B29K 2509/04; B29K 2995/0007; B29K 2995/0013; B29L 2031/3481
See application file for complete search history.

(56) References Cited

FOREIGN PATENT DOCUMENTS

| | | |
|---|---|---|
| JP | 2010-153639 A | 7/2010 |
| JP | 2010-157563 A | 7/2010 |
| JP | 2011-216564 A | 10/2011 |
| WO | 2009/041300 A1 | 4/2009 |

HEAT CONDUCTIVE INSULATING SHEET, POWER MODULE, AND MANUFACTURING METHOD THEREOF

TECHNICAL FIELD

The present invention relates to a heat conductive insulating sheet that has excellent thermal conductivity and electric insulation ability, a power module equipped with the heat conductive insulating sheet, and a manufacturing method thereof.

BACKGROUND ART

In power semiconductor chips, a transition from the conventional Si (silicon) chips to SiC chips that excel in high-temperature operation and can increase current density of the chip has been investigated in recent years. However, where a high-density current flows in a power semiconductor chip, the calorific value of the chip increases and, therefore, the heat of the power semiconductor chip needs to be efficiently dissipated. For this reason, it is necessary to increase thermal conductivity of a heat conductive insulating sheet while ensuring excellent electric insulation ability.

In order to meet this requirement, a heat conductive insulating sheet is used which is manufactured by using a resin composition in which a boron nitride powder that has excellent thermal conductivity and electric insulation ability is contained in a matrix resin such as a thermosetting resin. Boron nitride has a layered molecular structure similar to that of graphite, and the commercially available boron nitride particles have a scaly shape. Such scaly boron nitride particles are thermally anisotropic, and thermal conductivity thereof in the plane direction (a-axis direction) of the crystal is several times to several tens of times that in the thickness direction (c-axis direction). Therefore, it is expected that thermal conductivity of a sheet in the thickness direction can be greatly increased by orienting the scaly boron nitride particles contained in the sheet such that the a-axis direction of the scaly boron nitride particles matches the thickness direction of the sheet.

Accordingly, it has been suggested to increase thermal conductivity in the thickness direction of a sheet by compounding secondary aggregated particles obtained by aggregation of scaly boron nitride particles into the sheet (see, for example, Patent Documents 1 and 2).

Patent Document 1: Japanese Patent Application Laid-open No. 2003-060134
Patent Document 2: WO 2009/04130

SUMMARY OF INVENTION

Technical Problem

Where a heat conductive insulating sheet prepared by filling a thermosetting resin with non-aggregated scaly boron nitride particles is sealed by a transfer mold method together with a power semiconductor element or the like, electric insulation of a power module can be ensured even though the thermosetting resin does not demonstrate substantial flowability within a period of time in which the molding pressure is applied. However, since the secondary aggregated particles such as disclosed in Patent Documents 1 and 2 are porous bodies, when the heat conductive insulating sheet, in which the thermosetting resin is filled with the secondary aggregated particles, is sealed by a transfer mold method, a problem encountered where a thermosetting resin does not flow within the period of time the molding pressure is applied is that defects such as voids are easily generated in the sheet and thermal conductivity and electric insulation ability of the sheet are greatly degraded.

Accordingly, the present invention has been created to resolve the abovementioned problem, and it is an objective of the present invention to provide a method for manufacturing a power module equipped with a heat conductive insulating sheet, which has excellent thermal conductivity and electric insulation ability, by a transfer mold method.

Solution to the Problem

The inventors have determined that an advanced degree of curing of a heat conductive insulating sheet in a short period of time in which the molding pressure in transfer molding is applied is important for inhibiting the occurrence of defects such as voids in a sheet when a power module is manufactured by a transfer mold method. Accordingly, the inventors of the present invention, after conducting intensive studies of the curing state of the heat conductive insulating sheet before and after the transfer molding, have found that when a transfer mold method is used to manufacture a power module equipped with a heat conductive insulating sheet in which a thermosetting resin is filled with an inorganic filler including secondary aggregated particles formed by aggregation of primary particles of scaly boron nitride, excellent thermal conductivity and electric insulation ability of the heat conductive insulating sheet can be ensured by adequately controlling the advance of curing of the heat conductive insulating sheet, to complete the present invention.

Thus, the present invention provides a method for manufacturing, by a transfer mold method, a power module equipped with a heat conductive insulating sheet in which an inorganic filler including secondary aggregated particles formed by aggregation of primary particles of scaly boron nitride is dispersed in a thermosetting resin, wherein, curing of an uncured or semi-cured heat conductive insulating sheet during transfer molding is advanced such that the ratio of change of the curing degree of the heat conductive insulating sheet which is represented by formula (1) is equal to or greater than 30%:

$$\text{Ratio of change (\%) of curing degree of heat conductive insulating sheet} = [(B-C)/B] \times 100 \qquad (1)$$

where, in formula (1), B represents a calorific value (cal/g), as measured with a differential scanning calorimeter, until the pre-transfer-molding uncured or semi-cured heat conductive insulating sheet is completely cured, and C represents a calorific value (cal/g), as measured with the differential scanning calorimeter, until the pre-transfer-molding uncured or semi-cured heat conductive insulating sheet is completely cured after heat treatment for 90 seconds at 180° C.

Advantageous Effects of the Invention

In accordance with the present invention, it is possible to provide a method for manufacturing a power module equipped with a heat conductive insulating sheet which has excellent thermal conductivity and electric insulation ability.

DESCRIPTION OF EMBODIMENTS

Embodiment 1

A power module according to the present embodiment will be explained hereinbelow with reference to the drawings.

Figure 1:
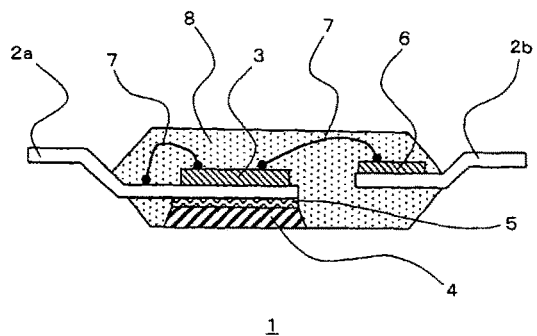
FIG. 1 is a cross-sectional schematic view of a power module according to Embodiment 1.

FIG. 1 is a cross-sectional schematic view of a power module according to the present embodiment. In FIG. 1, a power module 1 is provided with a power semiconductor element 3 that is carried on a lead frame 2a which is one heat radiating member, a heat sink 4 which is another heat radiating member, a heat conductive insulating sheet 5 which is disposed between the lead frame 2a and the heat sink 4 and in which an inorganic filler including secondary aggregated particles formed by aggregation of primary particles of scaly boron nitride is dispersed in a thermosetting resin, and a semiconductor element 6 for control that is carried on a lead frame 2b. Further, wire bonding with a metal wire 7 is performed between the power semiconductor element 3 and the semiconductor element 6 for control and between the power semiconductor element 3 and the lead frame 2a. The power module is sealed with a mold resin 8, except for the end portions of the lead frames 2a, 2b and a portion of the heat sink 4 for external heat radiation.

The specific feature of the method for manufacturing the power module 1 according to the present embodiment is that curing of the uncured or semi-cured heat conductive insulating sheet during transfer molding is advanced such that the ratio of change of the curing degree of the heat conductive insulating sheet which is represented by formula (1) is equal to or greater than 30%.

$$\text{Ratio of change (\%) of curing degree of heat conductive insulating sheet} = [(B-C)/B] \times 100 \quad (1)$$

In the formula, B represents a calorific value (cal/g), as measured with a differential scanning calorimeter, until the pre-transfer-molding uncured or semi-cured heat conductive insulating sheet is completely cured, and C represents a calorific value (cal/g), as measured with the differential scanning calorimeter, until the pre-transfer-molding uncured or semi-cured heat conductive insulating sheet is completely cured after heat treatment for 90 seconds at 180° C. Where the ratio of change of the curing degree is less than 30%, the curing of the heat conductive insulating sheet 5 cannot adequately advance during the transfer molding, defects such as voids appear inside the heat conductive insulating sheet 5, and thermal conductivity and electric insulation ability are greatly reduced. The calorific value as referred to in the present invention is a value measured using a differential scanning calorimeter (DSC3100) manufactured by MAC SCIENCE. In particular, when the inorganic filler includes 40 vol % or more of an inorganic filler having a particle size equal to or greater than 45 μm, or when the inorganic filler having a particle size equal to or greater than 45 μm is included in the heat conductive insulating sheet at 20 vol % or more, it is preferred that the curing of the uncured or semi-cured heat conductive insulating sheet be advanced such that the ratio of change of the curing degree of the heat conductive insulating sheet which is represented by formula (1) above becomes equal to or greater than 40%, more preferably equal to or greater than 50%.

The ratio of change of the curing degree of the heat conductive insulating sheet can be increased or decreased, as appropriate, by changing the composition of the material that constitutes the heat conductive insulating sheet or adjusting the curing state of the pre-transfer-molding heat conductive insulating sheet. More specifically, where the compounded amount of a curing agent is constant, the ratio of change of the curing degree can be increased by increasing the heating time or raising the heating temperature during the fabrication of the pre-transfer-molding uncured or semi-cured heat conductive insulating sheet. The ratio of change of the curing degree can be also increased by raising the compounded amount of a curing agent or curing enhancer. In this case, it is desirable that the heating time or heating temperature during the fabrication of the pre-transfer-molding uncured or semi-cured heat conductive insulating sheet be adjusted as appropriate and necessary.

In the present embodiment, the pre-transfer-molding heat conductive insulating sheet is in an uncured or semi-cured state. The uncured or semi-cured state, as referred to herein, is defined as a state in which the curing degree (%) of the heat conductive insulating sheet, which is represented by formula (2) below, is equal to or less than 40%.

$$\text{Curing degree (\%) of heat conductive insulating sheet} = [(A-B)/A] \times 100 \quad (2)$$

In the formula, A represents a calorific value (cal/g), as measured with a differential scanning calorimeter, until the coated and dried heat conductive insulating sheet is completely cured, and B represents a calorific value (cal/g), as measured with a differential scanning calorimeter, until the uncured or semi-cured heat conductive insulating sheet obtained by heat treating the coated and dried heat conductive insulating sheet is completely cured. Where the curing degree of the heat conductive insulating sheet exceeds 40%, the reaction of the heat conductive insulating sheet proceeds too far before the transfer molding, and the adhesion of the heat conductive insulating sheet and the heat radiating member cannot be ensured during the transfer molding. The curing degree of the heat conductive insulating sheet can be adjusted by changing, as appropriate, the compounded amount of the curing agent and the time or temperature of the heat treatment. Further, it is preferred that the temperature of the exothermic peak of the uncured or semi-cured heat conductive insulating sheet as measured with a differential scanning calorimeter (DSC3100) manufactured by MAC SCIENCE be equal to or less than 200° C. Where the temperature of the exothermic peak of the uncured or semi-cured heat conductive insulating sheet exceeds 200° C., the curing of the thermosetting resin does not proceed sufficiently during the transfer molding, the adhesion between the thermosetting resin and the secondary aggregation particles is insufficient, and electric insulation ability of the heat conductive insulating sheet 5 can decrease. Further, where the semi-width of the exothermic peak is small, the curing reaction of the thermosetting resin proceeds rapidly and, therefore, the thermosetting resin composition can be said to have excellent rapid curing ability. Where the semi-width of the exothermic peak is large, the rate of the curing reaction of the thermosetting resin is undesirably reduced. Therefore, from the standpoint of rapid curing ability, it is preferred that the exothermic peak temperature of the uncured or semi-cured heat conductive insulating sheet be equal to or less than 200° C. and the semi-width of the exothermic peak be small.

The filling ratio (ratio of the inorganic filler contained in the heat conductive insulating sheet 5) of the inorganic filler in the heat conductive insulating sheet 5 is preferably from 30 vol % to 80 vol %, more preferably from 40 vol % to 70 vol %. Where the filling ratio is less than 30 vol %, thermal conductivity of the heat conductive insulating sheet 5 decreases and heat radiation ability desirable for the power module 1 cannot be obtained. Meanwhile, where the filling ratio exceeds 80 vol %, the inorganic filler is difficult to disperse in the thermosetting resin and operability and moldability can be degraded. Furthermore, in this case, a heat conductive insulating sheet 5 of the desirable thickness sometimes cannot be obtained and the electric insulation ability can decrease.

The ratio of the secondary aggregated particles formed by aggregation of primary particles of scaly boron nitride (referred to hereinbelow simply as secondary aggregated particles) in the inorganic filler is preferably equal to or greater than 20 vol %. Where this ratio is less than 20 vol %, thermal conductivity of the heat conductive insulating sheet 5 decreases and heat radiation ability desirable for the power module 1 sometimes cannot be obtained. From the standpoint of obtaining higher heat radiation ability, it is more preferred that the ratio of the secondary aggregated particles in the inorganic filler be equal to or greater than 40 vol %.

The average particle size of the secondary aggregated particles is preferably from 20 µm to 180 µm, more preferably from 40 µm to 130 µm. Where the average particle size of the secondary aggregated particles is less than 20 µm, a heat conductive insulating sheet 5 having the desired thermal conductivity sometimes cannot be obtained. Meanwhile, where the average particle size of the secondary aggregated particles is greater than 180 µm, the secondary aggregated particles are difficult to disperse in the thermosetting resin and operability and moldability can be degraded. Furthermore, in this case, a heat conductive insulating sheet 5 of the desirable thickness sometimes cannot be obtained and the electric insulation ability can decrease. In the present embodiment, the average particle size of the secondary aggregated particles is a value obtained by measuring the particle size distribution by a laser diffraction and scattering method.

The shape of the secondary aggregated particles is not limited to a spherical shape and may have another shape such as a polygonal shape. When the shape is not spherical, the average particle size refers to the length of the long side in the shape. However, from the standpoint of enabling an increase in the compounded amount of the secondary aggregated particles while ensuring flowability of the thermosetting resin when the thermosetting resin sheet is manufactured, it is preferred that the secondary aggregated particles have a spherical shape.

The secondary aggregated particles can be manufactured by a well-known method by using primary particles of well-known scaly boron nitride. More specifically, the primary particles of well-known scaly boron nitride may be aggregated by a well-known method such as spray drying and then calcined and caused to grow. In this case, the calcination temperature is not limited, but is typically 2000° C.

The aggregation strength of the secondary aggregated particles can be represented by using a shape retention factor of the secondary aggregated particles as an indicator. The shape retention factor of the secondary aggregated particles means the ratio of change between the average particle sizes of the secondary aggregated particles before and after the application of ultrasonic waves when measuring the particle size distribution by a laser diffraction and scattering method, and can be represented by formula (3) below. Examples of ultrasonic wave application conditions include a frequency of from 10 kHz to 40 kHz, preferably 22.5 kHz, and an application time of from 3 minutes to 20 minutes, preferably 10 minutes.

Shape retention ratio=[(Average particle size of secondary aggregated particles after ultrasonic wave application)/(Average particle size of secondary aggregated particles before ultrasonic wave application)]×100   (3)

The shape retention ratio of the secondary aggregated particles represented by formula (3) above is closely related to the aggregation strength. Thus, when the aggregation strength of the secondary aggregated particles is small, the secondary aggregated particles are fractured by the application of ultrasonic waves and the average particle size of secondary aggregated particles after the ultrasonic wave application becomes less than the average particle size of secondary aggregated particles before the ultrasonic wave application, thereby decreasing the shape retention ratio. Meanwhile, where the aggregation strength of the secondary aggregated particles is large, the secondary aggregated particles are not fractured even when the ultrasonic waves are applied, the average particle size of secondary aggregated particles before and after the ultrasonic wave application is the same, and the shape retention ratio increases. In the present embodiment, the shape retention ratio of the secondary aggregated particles is preferably equal to or greater than 40%, more preferably equal to or greater than 50%. Where the shape retention ratio of the secondary aggregated particles is less than 40%, the aggregation strength of the secondary aggregated particles is too small. As a result, the secondary aggregated particles are fractured in the process for manufacturing (pressing step) the heat conductive insulating sheet 5 or by the molding pressure during transfer molding, thermal conductivity of the heat conductive insulating sheet 5 decreases and a heat radiation ability desirable for the power module 1 sometimes cannot be obtained.

The inorganic filler includes the secondary aggregated particles as an essential component, but can also include other typical inorganic powders within ranges in which the effects of the present application are not degraded. Specific, but not limiting, examples of such inorganic powders include primary particles of scaly boron nitride (BN), fused silica ($SiO_2$), crystalline silica ($SiO_2$), aluminum oxide ($Al_2O_3$), aluminum nitride (AlN), and silicon carbide (SiC). Those inorganic powders may be used individually or in combinations of two or more thereof. Among them, from the standpoint of further increasing thermal conductivity, the primary particles of scaly boron nitride are preferred. The average particle size of the inorganic powder is preferably from 0.5 µm to 100 µm, more preferably from 1 µm to 30 µm. Where the average particle size of the inorganic powder is less than 0.5 µm, the viscosity of the composition prior to molding increases, voids are admixed to the heat conductive insulating sheet 5, and heat radiation ability, insulation ability, and reliability of the power module 1 can decrease. Meanwhile, where the average particle size of the inorganic powder exceeds 100 µm, the ability of the inorganic powder to fill the heat conductive insulating sheet 5 decreases and voids can be admixed thereto.

The ratio of the inorganic filler having a particle size equal to or greater than 45 µm in the heat conductive insulating sheet 5 (the ratio of the inorganic filler having a particle size equal to or greater than 45 µm to the sum total of all components with the exception of solvent) is preferably equal to or greater than 20 vol %. Where the ratio of the inorganic filler having a particle size equal to or greater than 45 μm is less than 20 vol %, thermal conductivity of the heat conductive insulating sheet 5 decreases and the heat radiation ability of the power module 1 can decrease. The inorganic filler having a particle size equal to or greater than 45 μm can be secondary aggregated particles, an inorganic powder, or a combination thereof.

The thermosetting resin which is used for the heat conductive insulating sheet 5 is not particularly limited and a well-known thermosetting resin can be used. Examples of such thermosetting resin include bisphenol A epoxy resins, bisphenol F epoxy resins, cresol novolac epoxy resins, phenol novolac epoxy resins, alicyclic aliphatic epoxy resins, glycidyl aminophenol epoxy resins, dicyclopentadiene epoxy resins, naphthalene epoxy resins, biphenyl epoxy resins, glycidylamine epoxy resins, triphenolmethane epoxy resins, and anthracene epoxy resins. Those thermosetting resins may be used individually or in combinations of two or more thereof.

The thermosetting resin composition for manufacturing the heat conductive insulating sheet 5 can include a curing agent for curing the thermosetting resin. The curing agent is not particularly limited, and a well-known curing agent may be selected, as appropriate, according to the type of the thermosetting resin. Examples of such curing agents include alicyclic acid anhydrides such as methyltetrahydrophthalic acid anhydride, methylhexahydrophthalic acid anhydride, and himic anhydride; aliphatic acid anhydrides such as dodecenylsuccinic acid anhydride; aromatic acid anhydrides such as phthalic acid anhydride and trimellitic acid anhydride; organic dihydrazides such as dicyandiamide and adipic acid dihydrazide; tris(dimethylaminomethyl)phenol; dimethylbenzylamine; 1,8-diazabicyclo(5,4,0)undecene and derivatives thereof; imidazoles such as 2-methylimidazole, 2-ethyl-4-methylimidazole, 2-phenylimidazole, and 1-cyanoethyl-2-methylimidazole; and polyphenol compounds such as bisphenol A, bisphenol F, bisphenol S, phenol novolac resins, cresol novolac resins, and p-hydroxystyrene resins. Those curing agents may be used individually or in combinations of two or more thereof.

The compounded amount of the curing agent may be adjusted, as appropriate, according to the type of the thermosetting resin or curing agent which is to be used, and it is typically preferred that the compounded amount of the curing agent be from 0.1 parts by weight to 200 parts by weight per 100 parts by weight of the thermosetting resin.

In order to increase the adhesive force at the boundary of the thermosetting resin and the inorganic filler, the thermosetting resin composition for manufacturing the heat conductive insulating sheet 5 can include a coupling agent. The coupling agent is not particularly limited and a well-known coupling agent may be selected, as appropriate, according to the type of the thermosetting resin and the inorganic filler. Examples of suitable coupling agents include γ-glycidoxypropyltrimethoxysilane, N-β(aminoethyl)γ-aminopropyltriethoxysilane, N-phenyl-γ-aminopropyltrimethoxysilane, and γ-mercaptorpropyltrimethoxysilane. Those coupling agents may be used individually or in combinations of two or more thereof.

The compounded amount of the coupling agent may be adjusted, as appropriate, according to the type of the thermosetting resin or coupling agent which is to be used, and it is typically preferred that the compounded amount of the coupling agent be from 0.01 parts by weight to 5 parts by weight per 100 parts by weight of the thermosetting resin.

In order to adjust the viscosity of the composition, the thermosetting resin composition for manufacturing the heat conductive insulating sheet 5 can include a solvent. The solvent is not particularly limited and a well-known solvent may be selected, as appropriate, according to the type of the thermosetting resin or the inorganic filler which is to be used. Examples of suitable solvents include toluene and methyl ketone. Those solvents may be used individually or in combinations of two or more thereof.

The compounded amount of the solvent is not particularly limited, provided that the viscosity of the composition enables kneading, and it is typically preferred that the compounded amount of the solvent be from 20 parts by weight to 200 parts by weight per 100 parts by weight of the total of the thermosetting resin and the inorganic filler.

The power module 1 according to the present embodiment is manufactured by a transfer mold method, but the molding conditions are not limited. Typically, the molding temperature is from 80° C. to 250° C., preferably from 150° C. to 200° C., the molding pressure is from 5 MPa to 30 MPa, and the molding time is from 30 seconds to 180 seconds.

The power module 1 according to the present embodiment can be manufactured by a conventional method, except that the curing of the uncured or semi-cured heat conductive insulating sheet during transfer molding is advanced such that the ratio of change of the curing degree of the heat conductive insulating sheet which is represented by formula (1) above is equal to or greater than 30%. More specifically, initially, a resin solution is prepared by adding a thermosetting resin and a curing agent to a solvent, stirring, and mixing. In this case, a coupling agent can be added, as desired. Then, an inorganic filler including secondary aggregated particles obtained by aggregation of primary particles of scaly boron nitride is added to the resin solution, preparatory mixing is performed, and a thermosetting resin composition is then prepared by kneading. The obtained thermosetting resin composition is coated on a heat radiating member and then heated and pressurized to fabricate an uncured or semi-cured heat conductive insulating sheet. The sheet may be sealed together with the lead frame 2, the power semiconductor element 3, the heat sink 4, the semiconductor element 6 for control, and the metal wire 7 with the mold resin 8 by using the transfer mold method. The obtained power module 1 may be post-cured as necessary.

The specific gravity ratio of the heat conductive insulating sheet 5 of the power module 1 according to the present embodiment which is obtained by the above-mentioned manufacturing method is equal to or greater than 92%. Therefore, a very small number of defects such as voids are formed in the heat conductive insulating sheet 5, and thermal conductivity and electric insulation ability desirable for the power module 1 can be ensured. The specific gravity ratio of the heat conductive insulating sheet 5 is calculated by dividing the specific gravity of the heat conductive insulating sheet 5 measured by an Archimedes method by the theoretical specific gravity of the heat conductive insulating sheet 5 and multiplying the result by 100 ((measured specific gravity of the heat conductive insulating sheet 5)/(theoretical specific gravity of the heat conductive insulating sheet 5)×100). With the Archimedes method, part of the heat conductive insulating sheet 5 is cut off from the power module 1, the weight after drying and the weight in water (pure water) are measured with an electronic scale, the density of pure water is determined from the water temperature during the measurements, and the specific gravity ($\rho_s$) of the sample is calculated. Further, the theoretical specific gravity of the heat conductive insulating sheet 5 is calculated from the compounding ratio and density of components constituting the heat conductive insulating sheet 5.

Since the power module 1 according to the present embodiment can be manufactured by the transfer mold method, the power module merits good productivity and low cost.

Embodiment 2

The heat conductive insulating sheet of the present embodiment will be explained hereinbelow with reference to the drawings.

Figure 3:
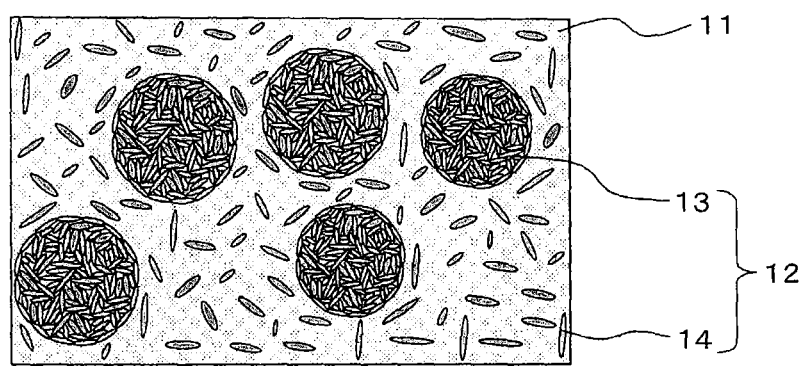
FIG. 3 is a cross-sectional schematic view of the heat conductive insulating sheet according to Embodiment 2.

FIG. 3 is a cross-sectional schematic view of the heat conductive insulating sheet according to the present embodiment. In FIG. 3, the heat conductive insulating sheet 5 is obtained by the transfer mold method and constituted by a thermosetting resin 11 serving as a matrix and an inorganic filler 12 dispersed in the thermosetting resin 11. The inorganic filler 12 is constituted by secondary aggregated particles 13 obtained by isotropic aggregation of primary particles of scaly boron nitride and by primary particles 14 of scaly boron nitride. Molding conditions of the transfer mold method are not limited, and typically, the molding temperature is from 80° C. to 250° C., preferably from 150° C. to 200° C., the molding pressure is from 5 MPa to 30 MPa, and the molding time is from 30 seconds to 180 seconds.

The heat conductive insulating sheet 5 according to the present embodiment is obtained by advancing curing of an uncured or semi-cured heat conductive insulating sheet such that a ratio of change of a curing degree of the heat conductive insulating sheet which is represented by formula (1) is equal to or greater than 30%.

$$\text{Ratio of change (\%) of curing degree of heat conductive insulating sheet} = [(B-C)/B] \times 100 \qquad (1)$$

In the formula, B represents a calorific value (cal/g), as measured with a differential scanning calorimeter, until the pre-transfer-molding uncured or semi-cured heat conductive insulating sheet is completely cured, and C represents a calorific value (cal/g), as measured with the differential scanning calorimeter, until the pre-transfer-molding uncured or semi-cured heat conductive insulating sheet is completely cured after heat treatment for 90 seconds at 180° C. Where the ratio of change of the curing degree is less than 30%, the curing of the heat conductive insulating sheet 5 does not adequately advance during the transfer molding but advances during the post-curing or during the operation of the product, defects such as voids appear inside the heat conductive insulating sheet 5, and thermal conductivity and electric insulation ability are greatly reduced. The calorific value as referred to in the present invention is a value measured using a differential scanning calorimeter (DSC3100) manufactured by MAC SCIENCE. In particular, when the inorganic filler 12 includes 40 vol % or more of an inorganic filler having a particle size equal to or greater than 45 µm, or when the inorganic filler having a particle size equal to or greater than 45 µm is included in the heat conductive insulating sheet 5 at 20 vol % or more, it is preferred that the curing of the uncured or semi-cured heat conductive insulating sheet be advanced such that the ratio of change of the curing degree of the heat conductive insulating sheet which is represented by formula (1) above becomes equal to or greater than 40%, more preferably equal to or greater than 50%.

The ratio of change of the curing degree of the heat conductive insulating sheet can be increased or decreased, as appropriate, by changing the composition of the material that constitutes the heat conductive insulating sheet or adjusting the curing state of the pre-transfer-molding heat conductive insulating sheet. More specifically, where the compounded amount of a curing agent is constant, the ratio of change of the curing degree can be increased by increasing the heating time or raising the heating temperature during the fabrication of the pre-transfer-molding uncured or semi-cured heat conductive insulating sheet. The ratio of change of the curing degree can be also increased by increasing the compounded amount of a curing agent or curing enhancer. In this case, it is desirable that the heating time or heating temperature during the fabrication of the pre-transfer-molding uncured or semi-cured heat conductive insulating sheet be adjusted as appropriate and necessary.

In the present embodiment, the pre-transfer-molding heat conductive insulating sheet is in the uncured or semi-cured state. The uncured or semi-cured state, as referred to herein, is defined as a state in which the curing degree (%) of the heat conductive insulating sheet, which is represented by formula (2) below, is equal to or less than 40%.

$$\text{Curing degree (\%) of heat conductive insulating sheet} = [(A-B)/A] \times 100 \qquad (2)$$

In the formula, A represents a calorific value (cal/g), as measured with a differential scanning calorimeter, until the coated and dried heat conductive insulating sheet is completely cured, and B represents a calorific value (cal/g), as measured with a differential scanning calorimeter, until the uncured or semi-cured heat conductive insulating sheet obtained by heat treating the coated and dried heat conductive insulating sheet is completely cured. Where the curing degree of the heat conductive insulating sheet exceeds 40%, the reaction of the heat conductive insulating sheet proceeds too far before the transfer molding, and the adhesion of the heat conductive insulating sheet and the heat radiating member cannot be ensured during the transfer molding. The curing degree of the heat conductive insulating sheet can be adjusted by changing, as appropriate, the compounded amount of the curing agent and the time or temperature of the heat treatment. Further, it is preferred that the temperature of the exothermic peak of the uncured or semi-cured heat conductive insulating sheet as measured with a differential scanning calorimeter (DSC3100) manufactured by MAC SCIENCE be equal to or less than 200° C. Where the temperature of the exothermic peak of the uncured or semi-cured heat conductive insulating sheet exceeds 200° C., the curing of the thermosetting resin 11 does not proceed sufficiently during the transfer molding, the adhesion between the thermosetting resin 11 and the secondary aggregation particles 13 is insufficient, and electric insulation ability of the heat conductive insulating sheet 5 can decrease. Further, where the semi-width of the exothermic peak is small, the curing reaction of the thermosetting resin proceeds rapidly and, therefore, the thermosetting resin composition can be said to have excellent rapid curing ability. Where the semi-width of the exothermic peak is large, the rate of the curing reaction of the thermosetting resin is undesirably reduced. Therefore, from the standpoint of rapid curing ability, it is preferred that the exothermic peak temperature of the uncured or semi-cured heat conductive insulating sheet be equal to or less than 200° C. and the semi-width of the exothermic peak be small.

The filling ratio (ratio of the inorganic filler 12 contained in the heat conductive insulating sheet 5) of the inorganic filler 12 in the heat conductive insulating sheet 5 is preferably from 30 vol % to 80 vol %, more preferably from 40 vol % to 70 vol %. Where the filling ratio of the inorganic filler 12 is less than 30 vol %, thermal conductivity of the heat conductive insulating sheet 5 can decrease. Meanwhile, where the filling ratio of the inorganic filler 12 exceeds 80 vol %, the inorganic filler 12 is difficult to disperse in the thermosetting resin 11 and operability and moldability can be degraded. Furthermore, in this case, a heat conductive insulating sheet 5 of the desirable thickness sometimes cannot be obtained and the electric insulation ability can decrease.

The ratio of the secondary aggregated particles 13 in the inorganic filler 12 is preferably equal to or greater than 20 vol %. Where this ratio is less than 20 vol %, thermal conductivity of the heat conductive insulating sheet 5 decreases. From the standpoint of obtaining higher heat radiation ability, it is more preferred that the ratio of the inorganic filler 12 in the secondary aggregated particles 13 be equal to or greater than 40 vol %.

The average particle size of the secondary aggregated particles 13 is preferably from 20 μm to 180 μm, more preferably from 40 μm to 130 μm. Where the average particle size of the secondary aggregated particles 13 is less than 20 μm, a heat conductive insulating sheet 5 having the desired thermal conductivity sometimes cannot be obtained. Meanwhile, where the average particle size of the secondary aggregated particles 13 is greater than 180 μm, the secondary aggregated particles 13 are difficult to disperse in the thermosetting resin 11 and operability and moldability can be degraded. Furthermore, in this case, a heat conductive insulating sheet 5 of the desirable thickness sometimes cannot be obtained and the electric insulation ability can decrease. In the present embodiment, the average particle size of the secondary aggregated particles is a value obtained by measuring the particle size distribution by a laser diffraction and scattering method.

The shape of the secondary aggregated particles 13 is not limited to a spherical shape and may have another shape such as a polygonal shape. When the shape is not spherical, the average particle size refers to the length of the long side in the shape. However, from the standpoint of enabling an increase in the compounded amount of the secondary aggregated particles 13 while ensuring flowability of the thermosetting resin 11 when the thermosetting resin sheet 5 is manufactured, it is preferred that the secondary aggregated particles 13 have a spherical shape.

The secondary aggregated particles 13 can be manufactured by a well-known method by using primary particles of well-known scaly boron nitride. More specifically, the primary particles of well-known scaly boron nitride may be aggregated by a well-known method such as spray drying and then calcined and caused to grow. In this case, the calcination temperature is not limited, but typically is 2000° C.

The aggregation strength of the secondary aggregated particles 13 can be represented by using the shape retention factor of the secondary aggregated particles as an indicator. The shape retention factor of the secondary aggregated particles means the ratio of change between the average particle sizes of the secondary aggregated particles before and after the application of ultrasonic waves when measuring the particle size distribution by a laser diffraction and scattering method, and can be represented by formula (3) below. Examples of ultrasonic wave application conditions include a frequency of from 10 kHz to 40 kHz, preferably 22.5 kHz, and an application time of from 3 minutes to 20 minutes, preferably 10 minutes.

$$\text{Shape retention ratio} = [(\text{Average particle size of secondary aggregated particles after ultrasonic wave application})/(\text{Average particle size of secondary aggregated particles before ultrasonic wave application})] \times 100 \quad (3)$$

The shape retention ratio of the secondary aggregated particles represented by formula (3) above is closely related to the aggregation strength. Thus, when the aggregation strength of the secondary aggregated particles is small, the secondary aggregated particles are fractured by the application of ultrasonic waves and the average particle size of secondary aggregated particles after the ultrasonic wave application becomes less than the average particle size of secondary aggregated particles before the ultrasonic wave application, thereby decreasing the shape retention ratio. Meanwhile, where the aggregation strength of the secondary aggregated particles is large, the secondary aggregated particles are not fractured even when the ultrasonic waves are applied, the average particle size of secondary aggregated particles before and after the ultrasonic wave application is the same, and the shape retention ratio increases. In the present embodiment, the shape retention ratio of the secondary aggregated particles is preferably equal to or greater than 40%, more preferably equal to or greater than 50%. Where the shape retention ratio of the secondary aggregated particles is less than 40%, the aggregation strength of the secondary aggregated particles is too small. As a result, the secondary aggregated particles are fractured in the process for manufacturing (pressing step) the heat conductive insulating sheet 5 or by the molding pressure during transfer molding, and thermal conductivity of the heat conductive insulating sheet 5 can decrease.

The average particle size of the primary particles 14 of scaly boron nitride is preferably from 0.5 μm to 100 μm, more preferably from 1 μm to 30 μm. Where the average particle size of the primary particles 14 of scaly boron nitride is less than 0.5 μm, the viscosity of the composition prior to molding increases, and voids can be admixed to the heat conductive insulating sheet 5. Meanwhile, where the average particle size of the primary particles 14 of scaly boron nitride exceeds 100 μm, the ability of the primary particles 14 of scaly boron nitride to fill the heat conductive insulating sheet 5 decreases and voids can be admixed thereto.

The inorganic filler 12 includes the secondary aggregated particles 13 and the primary particles 14 of scaly boron nitride, but can also include other typical inorganic powders within ranges in which the effect of the present application is not degraded. Specific, but not limiting, examples of such inorganic powders include fused silica ($SiO_2$), crystalline silica ($SiO_2$), aluminum oxide ($Al_2O_3$), aluminum nitride (AlN), and silicon carbide (SiC). Those inorganic powders may be used individually or in combinations of two or more thereof. The average particle size of the inorganic powder is preferably from 0.5 μm to 100 μm, more preferably from 1 μm to 30 μm. Where the average particle size of the inorganic powder is less than 0.5 μm, the viscosity of the composition prior to molding increases and voids can be admixed to the heat conductive insulating sheet 5. Meanwhile, where the average particle size of the inorganic powder exceeds 100 μm, the ability of the inorganic powder to fill the heat conductive insulating sheet 5 decreases and voids can be admixed thereto.

The ratio of the inorganic filler having a particle size equal to or greater than 45 μm in the heat conductive insulating sheet 5 (the ratio of the inorganic filler having a particle size equal to or greater than 45 μm to the sum total of all components with the exception of solvent) is preferably equal to or greater than 20 vol %. Where the ratio of the inorganic filler having a particle size equal to or greater than 45 µm is less than 20 vol %, thermal conductivity of the heat conductive insulating sheet 5 can decrease. The inorganic filler having a particle size equal to or greater than 45 µm can be the secondary aggregated particles 13, the primary particles 14 of scaly boron nitride, an inorganic powder, or a combination thereof.

The thermosetting resin 11 which is used for the heat conductive insulating sheet 5 is not particularly limited and a well-known thermosetting resin can be used. Examples of such thermosetting resin include bisphenol A epoxy resins, bisphenol F epoxy resins, cresol novolac epoxy resins, phenol novolac epoxy resins, alicyclic aliphatic epoxy resins, glycidyl aminophenol epoxy resins, dicyclopentadiene epoxy resins, naphthalene epoxy resins, biphenyl epoxy resins, glycidylamine epoxy resins, triphenolmethane epoxy resins, and anthracene epoxy resins. Those thermosetting resins may be used individually or in combinations of two or more thereof.

The thermosetting resin composition for manufacturing the heat conductive insulating sheet 5 can include a curing agent for curing the thermosetting resin 11. The curing agent is not particularly limited, and a well-known curing agent may be selected, as appropriate, according to the type of the thermosetting resin 11. Examples of such curing agents include alicyclic acid anhydrides such as methyltetrahydrophthalic acid anhydride, methylhexahydrophthalic acid anhydride, and himic anhydride; aliphatic acid anhydrides such as dodecenylsuccinic acid anhydride; aromatic acid anhydrides such as phthalic acid anhydride and trimellitic acid anhydride; organic dihydrazides such as dicyandiamide and adipic acid dihydrazide; tris(dimethylaminomethyl)phenol; dimethylbenzylamine; 1,8-diazabicyclo(5,4,0)undecene and derivatives thereof; imidazoles such as 2-methylimidazole, 2-ethyl-4-methylimidazole, 2-phenylimidazole, and 1-cyanoethyl-2-methylimidazole; and polyphenol compounds such as bisphenol A, bisphenol F, bisphenol S, phenol novolac resins, cresol novolac resins, and p-hydroxystyrene resins. Those curing agents may be used individually or in combinations of two or more thereof.

The compounded amount of the curing agent may be adjusted, as appropriate, according to the type of the thermosetting resin 11 or curing agent which is to be used, and it is typically preferred that the compounded amount of the curing agent be from 0.1 parts by weight to 200 parts by weight per 100 parts by weight of the thermosetting resin.

In order to increase the adhesive force at the boundary of the thermosetting resin 11 or the inorganic filler 12, the thermosetting resin composition for manufacturing the heat conductive insulating sheet 5 can include a coupling agent. The coupling agent is not particularly limited and a well-known coupling agent may be selected, as appropriate, according to the type of the thermosetting resin 11 or the inorganic filler 12. Examples of suitable coupling agents include γ-glycidoxypropyltrimethoxysilane, N-β(aminoethyl)γ-aminopropyltriethoxysilane, N-phenyl-γ-aminopropyltrimethoxysilane, and γ-mercaptopropyltrimethoxysilane. Those coupling agents may be used individually or in combinations of two or more thereof.

The compounded amount of the coupling agent may be adjusted, as appropriate, according to the type of the thermosetting resin 11 or coupling agent which is to be used, and it is typically preferred that the compounded amount of the coupling agent be from 0.01 parts by weight to 5 parts by weight per 100 parts by weight of the thermosetting resin.

In order to adjust the viscosity of the composition, the thermosetting resin composition for manufacturing the heat conductive insulating sheet 5 can include a solvent. The solvent is not particularly limited and a well-known solvent may be selected, as appropriate, according to the type of the thermosetting resin 11 or the inorganic filler 12 which is to be used. Examples of suitable solvents include toluene and methyl ketone. Those solvents may be used individually or in combinations of two or more thereof.

The compounded amount of the solvent is not particularly limited, provided that the viscosity of the composition enables kneading, and it is typically preferred that the compounded amount of the solvent be from 20 parts by weight to 200 parts by weight per 100 parts by weight of the total of the thermosetting resin 11 and the inorganic filler 12.

The heat conductive insulating sheet 5 according to the present embodiment can be manufactured by conventional methods, except that the curing of the uncured or semi-cured heat conductive insulating sheet during transfer molding is advanced such that the ratio of change of the curing degree of the heat conductive insulating sheet which is represented by formula (1) above is equal to or greater than 30%. The specific gravity ratio of the heat conductive insulating sheet 5 thus obtained is equal to or greater than 92%. Therefore, only a very small number of defects such as voids are formed in the heat conductive insulating sheet 5. The specific gravity ratio of the heat conductive insulating sheet 5 is calculated by dividing the specific gravity of the heat conductive insulating sheet 5 measured by an Archimedes method by the theoretical specific gravity of the heat conductive insulating sheet 5 and multiplying the result by 100 ((measured specific gravity of the heat conductive insulating sheet 5)/(theoretical specific gravity of the heat conductive insulating sheet 5)×100). With the Archimedes method, part of the heat conductive insulating sheet 5 is cut off, the weight after drying and the weight in water (pure water) are measured with an electronic scale, the density of the pure water is determined from the water temperature during the measurements, and the specific gravity ($\rho_s$) of the sample is calculated. Further, the theoretical specific gravity of the heat conductive insulating sheet 5 is calculated from the compounding ratio and density of components constituting the heat conductive insulating sheet 5.

EXAMPLES

The present invention will be explained hereinbelow in greater detail on the basis of examples and comparative examples which, however, place no limitation on the present invention.

Example 1

A total of 100 parts by mass of a liquid bisphenol A epoxy resin (jER828: manufactured by Mitsubishi Chemical Corp.) and 0.5 parts by mass of 1-cyanoethyl-2-methylimidazole (Curesol 2PN-CN, manufactured by Shikoku Chemicals Corp.) were added to 125 parts by mass of methyl ethyl ketone, followed by stirring and mixing. An inorganic filler including 50 vol % of secondary aggregated particles I (the average particle size was 60 µm and the ratio of particles having a particle size equal to or greater than 45 µm was 67 vol %; manufactured by Momentive Performance Materials Inc.) obtained by aggregation of primary particles of scaly boron nitride and 50 vol % of primary particles of scaly boron nitride (the average particle size was 8 µm and the ratio of particles having a particle size equal to or greater than 45 µm was 0 vol %; manufactured by Denki Kagaku Kogyo KK) was added to the resin solution at 50 vol % with respect to the total volume of all of the components, with the exception of the solvent, followed by pre-mixing. The pre-mixture was kneaded with three rolls and a thermosetting resin composition in which the inorganic filler was uniformly dispersed was prepared. In the thermosetting resin composition, the ratio of the inorganic filler having a particle size equal to or greater than 45 μm was 33.5 vol % with respect to the entire inorganic filler.

A semi-cured heat conductive insulating sheet with a thickness of 200 μm was then fabricated by coating the thermosetting resin composition by a doctor blade method on a heat radiation member with a thickness of 105 μm, removing the solvent, and then pressurizing for 10 minutes at 100° C. A power module was then fabricated by using the semi-cured heat conductive insulating sheet, sealing with a mold resin by a transfer mold method (molding temperature: 180° C., molding time: 180 seconds, molding pressure: 10 MPa), and then post-curing for 6 hours at 175° C. The heat conductive insulating sheet was then removed from the obtained power module, the specific gravity thereof was measured, and the specific gravity ratio was calculated. The result was 94%.

The curing degree of the semi-cured heat conductive insulating sheet was 10%, the exothermic peak temperature was 192° C., and the ratio of change of the curing degree was 32%.

Example 2

A semi-cured heat conductive insulating sheet with a thickness of 200 μm was fabricated in the same manner as in Example 1, except that the pressurization was performed for 15 minutes at 120° C. after removing the solvent, and a power module was fabricated by using the semi-cured heat conductive insulating sheet. The heat conductive insulating sheet was then removed from the obtained power module, the specific gravity thereof was measured, and the specific gravity ratio was calculated. The result was 96%.

The curing degree of the semi-cured heat conductive insulating sheet was 21%, the exothermic peak temperature was 188° C., and the ratio of change of the curing degree was 46%.

Example 3

A semi-cured heat conductive insulating sheet was fabricated in the same manner as in Example 1, except that the pressurization was performed for 25 minutes at 120° C. after removing the solvent, and a power module was fabricated by using the semi-cured heat conductive insulating sheet. The heat conductive insulating sheet was then removed from the obtained power module, the specific gravity thereof was measured, and the specific gravity ratio was calculated. The result was 96%.

The curing degree of the semi-cured heat conductive insulating sheet was 25%, the exothermic peak temperature was 189° C., and the ratio of change of the curing degree was 55%.

Example 4

A semi-cured heat conductive insulating sheet was fabricated in the same manner as in Example 1, except that the compounded amount of 1-cyanoethyl-2-methylimidazole was changed to 1 part by mass and the pressurization was performed for 15 minutes at 100° C. after removing the solvent, and a power module was fabricated by using the semi-cured heat conductive insulating sheet. The heat conductive insulating sheet was then removed from the obtained power module, the specific gravity thereof was measured, and the specific gravity ratio was calculated. The result was 98%.

The curing degree of the semi-cured heat conductive insulating sheet was 13%, the exothermic peak temperature was 181° C., and the ratio of change of the curing degree was 73%.

Example 5

A semi-cured heat conductive insulating sheet was fabricated in the same manner as in Example 1, except that the compounded amount of 1-cyanoethyl-2-methylimidazole was changed to 2 parts by mass and the pressurization was performed for 15 minutes at 110° C. after removing the solvent, and a power module was fabricated by using the semi-cured heat conductive insulating sheet. The heat conductive insulating sheet was then removed from the obtained power module, the specific gravity thereof was measured, and the specific gravity ratio was calculated. The result was 99%.

The curing degree of the semi-cured heat conductive insulating sheet was 16%, the exothermic peak temperature was 176° C., and the ratio of change of the curing degree was 89%.

Example 6

A total of 100 parts by mass of a liquid bisphenol A epoxy resin (jER828: manufactured by Mitsubishi Chemical Corp.) and 2 parts by mass of 1-cyanoethyl-2-methylimidazole (Curesol 2PN-CN, manufactured by Shikoku Chemicals Corp.) were added to 125 parts by mass of methyl ethyl ketone, followed by stirring and mixing. An inorganic filler including 50 vol % of secondary aggregated particles II (the average particle size was 65 μm and the ratio of particles having a particle size equal to or greater than 45 μm was 77.5 vol %) obtained by aggregation of primary particles of scaly boron nitride and 50 vol % of primary particles of scaly boron nitride (the average particle size was 8 μm and the ratio of particles having a particle size equal to or greater than 45 μm was 0 vol %; manufactured by Denki Kagaku Kogyo KK) was added to the resin solution at 50 vol % with respect to the total volume of all of the components, with the exception of the solvent, followed by pre-mixing. The pre-mixture was kneaded with three rolls and a thermosetting resin composition in which the inorganic filler was uniformly dispersed was prepared. In the thermosetting resin composition, the ratio of the inorganic filler having a particle size equal to or greater than 45 μm was 38.8 vol % with respect to the entire inorganic filler.

A semi-cured heat conductive insulating sheet with a thickness of 200 μm was then fabricated by coating the thermosetting resin composition by a doctor blade method on a heat radiation member with a thickness of 105 μm, removing the solvent, and then pressurizing for 15 minutes at 110° C. A power module was then fabricated by using the semi-cured heat conductive insulating sheet, sealing with a mold resin by a transfer mold method (molding temperature: 180° C., molding time: 180 seconds, molding pressure: 10 MPa), and then post-curing for 6 hours at 175° C. The heat conductive insulating sheet was then removed from the obtained power module, the specific gravity thereof was measured, and the specific gravity ratio was calculated. The result was 98%. The curing degree of the semi-cured heat conductive insulating sheet was 17%, the exothermic peak temperature was 174° C., and the ratio of change of the curing degree was 90%. The ratio of the inorganic filler having a particle size equal to or greater than 45 μm was 19.4 vol % with respect to the heat conductive insulating sheet (total of all of the components, with the exception of the solvent).

Example 7

A thermosetting resin composition was prepared in the same manner as in Example 6, except that the inorganic filler was replaced with an inorganic filler including 60 vol % of secondary aggregated particles II (the average particle size was 65 μm and the ratio of particles having a particle size equal to or greater than 45 μm was 77.5 vol %) obtained by aggregation of primary particles of scaly boron nitride and 40 vol % of primary particles of scaly boron nitride (the average particle size was 8 μm and the ratio of particles having a particle size equal to or greater than 45 μm was 0 vol %; manufactured by Denki Kagaku Kogyo KK). In the thermosetting resin composition, the ratio of the inorganic filler having a particle size equal to or greater than 45 μm was 46.5 vol % with respect to the entire inorganic filler. A semi-cured heat conductive insulating sheet was fabricated and a power module was then fabricated by using the semi-cured heat conductive insulating sheet in the same manner as in Example 6. The heat conductive insulating sheet was then removed from the obtained power module, the specific gravity thereof was measured, and the specific gravity ratio was calculated. The result was 97%. The curing degree of the semi-cured heat conductive insulating sheet was 16%, the exothermic peak temperature was 174° C., and the ratio of change of the curing degree was 81%. The ratio of the inorganic filler having a particle size equal to or greater than 45 μm was 20.9 vol % with respect to the heat conductive insulating sheet (total of all of the components, with the exception of the solvent).

Example 8

A thermosetting resin composition was prepared in the same manner as in Example 6, except that the inorganic filler was replaced with an inorganic filler including 70 vol % of secondary aggregated particles II (the average particle size was 65 μm and the ratio of particles having a particle size equal to or greater than 45 μm was 77.5 vol %) obtained by aggregation of primary particles of scaly boron nitride and 30 vol % of primary particles of scaly boron nitride (the average particle size was 8 μm and the ratio of particles having a particle size equal to or greater than 45 μm was 0 vol %; manufactured by Denki Kagaku Kogyo KK). In the thermosetting resin composition, the ratio of the inorganic filler having a particle size equal to or greater than 45 μm was 54.3 vol % with respect to the entire inorganic filler. A semi-cured heat conductive insulating sheet was fabricated and a power module was then fabricated by using the semi-cured heat conductive insulating sheet in the same manner as in Example 6. The heat conductive insulating sheet was then removed from the obtained power module, the specific gravity thereof was measured, and the specific gravity ratio was calculated. The result was 94%. The curing degree of the semi-cured heat conductive insulating sheet was 17%, the exothermic peak temperature was 175° C., and the ratio of change of the curing degree was 86%. The ratio of the inorganic filler having a particle size equal to or greater than 45 μm was 27.1 vol % with respect to the heat conductive insulating sheet (total of all of the components, with the exception of the solvent).

Example 9

A thermosetting resin composition was prepared in the same manner as in Example 6, except that an inorganic filler including 85 vol % of secondary aggregated particles II (the average particle size was 65 μm and the ratio of particles having a particle size equal to or greater than 45 μm was 77.5 vol %) obtained by aggregation of primary particles of scaly boron nitride and 15 vol % of primary particles of scaly boron nitride (the average particle size was 8 μm and the ratio of particles having a particle size equal to or greater than 45 μm was 0 vol %; manufactured by Denki Kagaku Kogyo KK) was added at 30 vol % with respect to the total volume of all of the components, with the exception of the solvent. In the thermosetting resin composition, the ratio of the inorganic filler having a particle size equal to or greater than 45 μm was 65.9 vol % with respect to the entire inorganic filler. A semi-cured heat conductive insulating sheet was fabricated and a power module was then fabricated by using the semi-cured heat conductive insulating sheet in the same manner as in Example 6. The heat conductive insulating sheet was then removed from the obtained power module, the specific gravity thereof was measured, and the specific gravity ratio was calculated. The result was 98%. The curing degree of the semi-cured heat conductive insulating sheet was 19%, the exothermic peak temperature was 179° C., and the ratio of change of the curing degree was 91%. The ratio of the inorganic filler having a particle size equal to or greater than 45 μm was 19.76 vol % with respect to the heat conductive insulating sheet (total of all of the components, with the exception of the solvent).

Example 10

A thermosetting resin composition was prepared in the same manner as in Example 6, except that an inorganic filler including 20 vol % of secondary aggregated particles II (the average particle size was 65 μm and the ratio of particles having a particle size equal to or greater than 45 μm was 77.5 vol %) obtained by aggregation of primary particles of scaly boron nitride and 80 vol % of primary particles of scaly boron nitride (the average particle size was 8 μm and the ratio of particles having a particle size equal to or greater than 45 μm was 0 vol %; manufactured by Denki Kagaku Kogyo KK) was added at 60 vol % with respect to the total volume of all of the components, with the exception of the solvent. In the thermosetting resin composition, the ratio of the inorganic filler having a particle size equal to or greater than 45 μm was 15.5 vol % with respect to the entire inorganic filler. A semi-cured heat conductive insulating sheet was fabricated and a power module was then fabricated by using the semi-cured heat conductive insulating sheet in the same manner as in Example 6. The heat conductive insulating sheet was then removed from the obtained power module, the specific gravity thereof was measured, and the specific gravity ratio was calculated. The result was 93%. The curing degree of the semi-cured heat conductive insulating sheet was 14%, the exothermic peak temperature was 172° C., and the ratio of change of the curing degree was 80%. The ratio of the inorganic filler having a particle size equal to or greater than 45 μm was 20.9 vol % with respect to the heat conductive insulating sheet (total of all of the components, with the exception of the solvent).

Comparative Example 1

A total of 100 parts by mass of a liquid bisphenol A epoxy resin (jER828: manufactured by Mitsubishi Chemical Corp.) and 0.5 parts by mass of 1-cyanoethyl-2-methylimidazole (Curesol 2PN-CN, manufactured by Shikoku Chemicals Corp.) as a curing agent were added to 125 parts by mass of methyl ethyl ketone, followed by stirring and mixing. An inorganic filler constituted by primary particles of scaly boron nitride (the average particle size was 8 μm; manufactured by Denki Kagaku Kogyo KK) was added to the resin solution at 50 vol % with respect to the total volume of all of the components, with the exception of the solvent, followed by pre-mixing. The pre-mixture was kneaded with three rolls and a thermosetting resin composition in which the inorganic filler was uniformly dispersed was prepared.

A semi-cured heat conductive insulating sheet with a thickness of 200 μm was then fabricated by coating the thermosetting resin composition by a doctor blade method on a heat radiation member with a thickness of 105 μm, removing the solvent, and then pressurizing for 20 minutes at 120° C. A power module was then fabricated by using the semi-cured heat conductive insulating sheet, sealing with a mold resin by a transfer mold method (molding temperature: 180° C., molding time: 180 seconds, molding pressure: 10 MPa), and then post-curing for 6 hours at 175° C. The heat conductive insulating sheet was then removed from the obtained power module, the specific gravity thereof was measured, and the specific gravity ratio was calculated. The result was 96%.

The curing degree of the semi-cured heat conductive insulating sheet was 22%, the exothermic peak temperature was 191° C., and the ratio of change of the curing degree was 50%.

Comparative Example 2

A semi-cured heat conductive insulating sheet was fabricated in the same manner as in Example 1, except that the compounded amount of 1-cyanoethyl-2-methylimidazole was changed to 0.2 parts by mass, and a power module was fabricated by using the semi-cured heat conductive insulating sheet. The heat conductive insulating sheet was then removed from the obtained power module, the specific gravity thereof was measured, and the specific gravity ratio was calculated. The result was 89%.

The curing degree of the semi-cured heat conductive insulating sheet was 3%, the exothermic peak temperature was 212° C., and the ratio of change of the curing degree was 18%.

Comparative Example 3

A semi-cured heat conductive insulating sheet was fabricated in the same manner as in Example 1, except that the compounded amount of 1-cyanoethyl-2-methylimidazole was changed to 0.3 parts by mass, and a power module was fabricated by using the semi-cured heat conductive insulating sheet. The heat conductive insulating sheet was then removed from the obtained power module, the specific gravity thereof was measured, and the specific gravity ratio was calculated. The result was 91%.

The curing degree of the semi-cured heat conductive insulating sheet was 6%, the exothermic peak temperature was 206° C., and the ratio of change of the curing degree was 27%.

[Evaluation of Thermal Conductivity]

Thermal conductivity in the thickness direction of a sheet was measured by a laser flash method with respect to the heat conductive insulating sheets of the power modules obtained in Examples 1 to 10 and Comparative Examples 1 to 3. The results on thermal conductivity are shown in Table 1 as relative values of thermal conductivity obtained for the heat conductive insulating sheets of the examples or comparative examples by using as a reference the thermal conductivity obtained for the heat conductive insulating sheet of Comparative Example 1 ([thermal conductivity of the heat conductive insulating sheets of examples or comparative examples]/[thermal conductivity of the heat conductive insulating sheet of Comparative Example 1]).

[Evaluation of Electric Insulation Ability]

Figure 2:
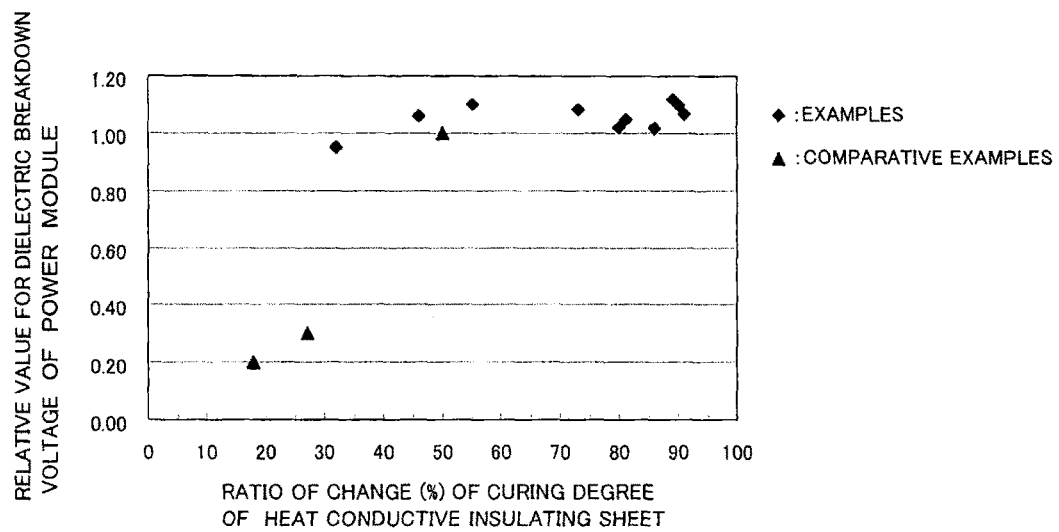
FIG. 2 illustrates the relationship between the ratio of change of the curing degree of the heat conductive insulating sheets in Examples 1 to 10 and Comparative Examples 1 to 3 and the relative value of the dielectric breakdown voltage of the power module.

The dielectric breakdown voltage (BDV) of the power modules obtained in Examples 1 to 10 and Comparative Examples 1 to 3 was measured by applying a voltage at a constant voltage increase rate of 1 kV/sec between the heat conductive insulating sheets of the power modules in oil. The results on BDV of the power modules are shown in Table 1 as relative values of BDV obtained for the heat conductive insulating sheets of the examples or comparative examples by using as a reference the BDV obtained for the heat conductive insulating sheet of Comparative Example 1 ([BDV of the heat conductive insulating sheets of examples or comparative examples]/[BDV of the heat conductive insulating sheet of Comparative Example 1]). The relationship between the ratio of change of the curing degree of the heat conductive insulating sheets of Examples 1 to 10 and Comparative Examples 1 to 3 and the relative values of the dielectric breakdown voltage of power modules is depicted in FIG. 2.

TABLE 1

| | | Examples | | | | | | |
|---|---|---|---|---|---|---|---|---|
| | | 1 | 2 | 3 | 4 | 5 | 6 | 7 |
| Thermosetting resin (parts by mass) | | 100 | 100 | 100 | 100 | 100 | 100 | 100 |
| Curing agent (parts by mass) | | 0.5 | 0.5 | 0.5 | 1 | 2 | 2 | 2 |
| Inorganic filler | Secondary aggregated particles I (parts by mass) | 95.5 | 95.5 | 95.5 | 95.5 | 95.5 | | |
| | Secondary aggregated particles II (parts by mass) | | | | | | 96.5 | 115.8 |
| | Primary particles (parts by mass) | 95.5 | 95.5 | 95.5 | 95.5 | 95.5 | 96.5 | 77.2 |

TABLE 1-continued

|  | | | | | | | |
|---|---|---|---|---|---|---|---|
| Solvent (parts by mass) | 125 | 125 | 125 | 125 | 125 | 125 | 140 |
| Ratio of entire inorganic filler in heat conductive insulating sheet (vol %) | 50 | 50 | 50 | 50 | 50 | 50 | 50 |
| Ratio of secondary aggregated particles in inorganic filler (vol %) | 50 | 50 | 50 | 50 | 50 | 50 | 60 |
| Ratio of inorganic filler having particle size equal to or greater than 45 µm in inorganic filler (vol %) | 33.5 | 33.5 | 33.5 | 33.5 | 33.5 | 38.8 | 46.5 |
| Ratio of inorganic filler having particle size equal to or greater than 45 µm in heat conductive insulating sheet (vol %) | 16.8 | 16.8 | 16.8 | 16.8 | 16.8 | 19.4 | 20.9 |
| Exothermic peak temperature (° C.), as determined by DSC, of heat conductive insulating sheet before molding | 192 | 188 | 189 | 181 | 176 | 174 | 174 |
| Ratio of change of curing degree (%) | 32 | 46 | 55 | 73 | 89 | 90 | 81 |
| Specific gravity ratio of heat conductive insulating sheet (%) | 94 | 96 | 96 | 98 | 99 | 98 | 97 |
| Relative value for thermal conductivity | 1.9 | 1.9 | 2.0 | 2.0 | 2.1 | 2.1 | 2.4 |
| Relative value for dielectric breakdown voltage | 0.95 | 1.06 | 1.10 | 1.08 | 1.12 | 1.10 | 1.05 |

| | | | Examples | | | Comparative Examples | |
|---|---|---|---|---|---|---|---|
| | | | 8 | 9 | 10 | 1 | 2 | 3 |
| Thermosetting resin (parts by mass) | | | 100 | 100 | 100 | 100 | 100 | 100 |
| Curing agent (parts by mass) | | | 2 | 2 | 2 | 0.5 | 0.2 | 0.3 |
| Inorganic filler | Secondary aggregated particles I (parts by mass) | | | | | | 95.5 | 95.5 |
| | Secondary aggregated particles II (parts by mass) | | 135.1 | 70.29 | 57.89 | | | |
| | Primary particles (parts by mass) | | 57.9 | 12.4 | 231.5 | 191 | 95.5 | 95.5 |
| Solvent (parts by mass) | | | 155 | 110 | 170 | 125 | 125 | 125 |
| Ratio of entire inorganic filler in heat conductive insulating sheet (vol %) | | | 50 | 30 | 60 | 50 | 50 | 50 |
| Ratio of secondary aggregated particles in inorganic filler (vol %) | | | 70 | 85 | 20 | 0 | 50 | 50 |
| Ratio of inorganic filler having particle size equal to or greater than 45 µm in inorganic filler (vol %) | | | 54.3 | 65.9 | 15.5 | 0 | 33.5 | 33.5 |
| Ratio of inorganic filler having particle size equal to or greater than 45 µm in heat conductive insulating sheet (vol %) | | | 27.1 | 19.76 | 20.9 | 0 | 16.8 | 16.8 |
| Exothermic peak temperature (° C.), as determined by DSC, of heat conductive insulating sheet before molding | | | 175 | 179 | 172 | 191 | 212 | 206 |
| Ratio of change of curing degree (%) | | | 86 | 91 | 80 | 50 | 18 | 27 |
| Specific gravity ratio of heat conductive insulating sheet (%) | | | 94 | 98 | 93 | 96 | 89 | 91 |
| Relative value for thermal conductivity | | | 2.5 | 2.2 | 2.3 | 1.0 | 1.5 | 1.6 |
| Relative value for dielectric breakdown voltage | | | 1.02 | 1.07 | 1.02 | 1.00 | 0.20 | 0.30 |

It follows from Table 1, that the power modules of Examples 1 to 10 which are equipped with heat conductive insulating sheets including secondary aggregated particles of boron nitride and having the ratio of change of curing degree equal to or greater than 30% demonstrate excellent thermal conductivity. Further, it is clear that the power modules of Examples 1 to 10 have a relative value of BDV on par with the power module of Comparative Example 1 which is equipped with the heat conductive insulating sheet containing no secondary aggregated particles of boron nitride and also demonstrate excellent electric insulation ability. By contrast, it is clear that the power module of Comparative Example 1 which is equipped with the heat conductive insulating sheet containing no secondary aggregated particles of boron nitride has excellent electric insulation ability but has a low thermal conductivity. Further, it is clear that the power modules of Comparative Examples 2 and 3 which are equipped with the heat conductive insulating sheets containing secondary aggregated particles of boron nitride but having a ratio of change of curing degree less than 30% have a large number of defects such as voids (specific gravity ratio of the heat conductive insulating sheets is small) and the degraded electric insulation ability, while having a comparatively good thermal conductivity.

It follows from the above, that when a power module equipped with a heat conductive insulating sheet including secondary aggregated particles of boron nitride is manufactured by a transfer mold method, excellent electric insulation ability and thermal conductivity can be ensured by advancing the curing of the semi-cured heat conductive insulating sheet during the transfer molding such that the ratio of change of the curing degree of the heat conductive insulating sheet is equal to or greater than 30%.

EXPLANATION ON NUMERALS

1—power module; 2a, 2b—lead frame; 3—power semiconductor element; 4—heat sink; 5—heat conductive insulating sheet; 6—semiconductor element for control; 7—metal wire; 8—mold resin; 11—thermosetting resin; 12—inorganic filler; 13—secondary aggregated particle formed by aggregation of primary particles of scaly boron nitride; 14—primary particle of scaly boron nitride

The invention claimed is:

1. A method for manufacturing a power module equipped with a heat conductive insulating sheet, comprising:
transfer-molding a power module comprising an uncured or semi-cured heat conductive insulating sheet such that the uncured or semi-cured heat conductive insulating sheet is cured during the transfer-molding and that a ratio of change of a curing degree of the uncured or semi-cured heat conductive insulating sheet during the transfer-molding is equal to or greater than 30%,
wherein the ratio of change is calculated by formula (1):

$$[(B-C)/B] \times 100 \qquad (1),$$

where B represents a calorific value (cal/g) until the uncured or semi-cured heat conductive insulating sheet is completely cured, and C represents a calorific value (cal/g) until a partially cured heat conductive insulating sheet obtained by heat treating the uncured or semi-cured heat conductive insulating sheet for 90 seconds at 180° C. is completely cured, the calorific values of B and C being measured with a differential scanning calorimeter, and wherein the heat conductive insulating sheet comprises a thermosetting resin and an inorganic filler dispersed in the thermosetting resin, the inorganic filler comprising secondary particles formed by aggregating scaly boron nitride primary particles.

2. The method according to claim 1, wherein an amount of the secondary particles in the inorganic filler is equal to or greater than 20 vol %.

3. The method according to claim 1, wherein an amount of the inorganic filler in the heat conductive insulating sheet is from 30 vol % to 80 vol %.

4. The method according to claim 1, wherein a temperature of an exothermic peak of the uncured or semi-cured heat conductive insulating sheet as measured with the differential scanning calorimeter is equal to or less than 200° C.

5. The method according to claim 1, further comprising: heating a thermosetting resin composition comprising the inorganic filler to obtain the uncured or semi-cured heat conductive insulating sheet, prior to the transfer-molding.

6. The method according to claim 1, further comprising: sealing the uncured or semi-cured heat conductive insulating sheet with a mold resin, wherein the uncured or semi-cured heat conductive insulating sheet sealed with the mold resin is subjected to the transfer-molding.

7. The method according to claim 1, wherein the uncured or semi-cured heat conductive insulating sheet is transfer-molded together with at least one component selected from the group consisting of a lead frame, a power semiconductor, a heat sink, a control semiconductor, and a metal wire.

8. The method according to claim 1, wherein the transfer-molding is performed at a molding temperature of from 80° C. to 250° C.

9. The method according to claim 1, wherein the transfer-molding is performed at a molding pressure of from 5 MPa to 30 MPa.

10. The method according to claim 1, wherein the transfer-molding is performed for 30 seconds to 180 seconds.

11. The method according to claim 1, wherein the transfer-molding is performed at a molding temperature of from 80° C. to 250° C., a molding pressure of from 5 MPa to 30 MPa, and for 30 seconds to 180 seconds.

12. The method according to claim 5, wherein the heating of the thermosetting resin composition is performed at a temperature of 100° C. to 120° C. for 10 minutes to 25 minutes.

* * * * *